(12) United States Patent
Turney et al.

(10) Patent No.: US 8,964,388 B2
(45) Date of Patent: Feb. 24, 2015

(54) INTEGRATED BLOWER DIFFUSER AND HEAT EXCHANGER FOR ELECTRONICS ENCLOSURE

(71) Applicant: Hamilton Sundstrand Corporation, Windsor Locks, CT (US)

(72) Inventors: Joseph Turney, Amston, CT (US); Brian St. Rock, Andover, CT (US); John H. Whiton, South Windsor, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 321 days.

(21) Appl. No.: 13/632,013

(22) Filed: Sep. 30, 2012

(65) Prior Publication Data

US 2014/0092556 A1   Apr. 3, 2014

(51) Int. Cl.
*H05K 7/20* (2006.01)

(52) U.S. Cl.
CPC ........ *H05K 7/20145* (2013.01); *H05K 7/20154* (2013.01)
USPC ........................... 361/697; 361/696; 165/80.4

(58) Field of Classification Search
CPC .......... H05K 7/20172; H05K 7/20254; H05K 7/20909; G06F 1/20; H01L 2924/002; H01L 23/467; H01L 24/473
USPC .......................................................... 361/696
See application file for complete search history.

(56) References Cited

U.S. PATENT DOCUMENTS

| | | | | |
|---|---|---|---|---|
| 5,597,035 A * | 1/1997 | Smith et al. | | 165/80.3 |
| 6,064,571 A * | 5/2000 | Noble | | 361/695 |
| 7,252,139 B2 * | 8/2007 | Novotny et al. | | 165/80.2 |
| 7,256,993 B2 * | 8/2007 | Cravens et al. | | 361/690 |
| 7,495,912 B2 * | 2/2009 | Long et al. | | 361/697 |
| 8,081,458 B2 * | 12/2011 | Liu | | 361/695 |
| 2003/0042004 A1 * | 3/2003 | Novotny et al. | | 165/80.2 |
| 2006/0249278 A1 * | 11/2006 | Liu et al. | | 165/80.4 |
| 2007/0284094 A1 * | 12/2007 | Pawlak et al. | | 165/122 |
| 2011/0146740 A1 | 6/2011 | St. Rock et al. | | |
| 2011/0232885 A1 | 9/2011 | Kaslusky et al. | | |
| 2012/0006511 A1 | 1/2012 | Kaslusky et al. | | |
| 2012/0014064 A1 | 1/2012 | St. Rock et al. | | |
| 2012/0050990 A1 | 3/2012 | Kaslusky et al. | | |
| 2012/0063088 A1 * | 3/2012 | Fu et al. | | 361/697 |

* cited by examiner

*Primary Examiner* — Gregory Thompson
(74) *Attorney, Agent, or Firm* — Carlson, Gaskey & Olds, PC

(57) ABSTRACT

An electronics enclosure has a blower and diffuser received within an enclosure. Electronic components are also received within the enclosure. The blower diffuser is positioned in contact with at least one of the electronic components. A shroud surrounds the blower diffuser and the at least one electronic component, and is spaced from an outer surface of the at least one electronic component. An opening is formed through the shroud, such that air can be driven within the shroud from the blower diffuser, and across at least one electronic component, and then outwardly of the opening. A heat exchanger is positioned in the path of air leaving the opening.

8 Claims, 3 Drawing Sheets

INTEGRATED BLOWER DIFFUSER AND HEAT EXCHANGER FOR ELECTRONICS ENCLOSURE

BACKGROUND OF THE INVENTION

This invention was made with government support under Contract No. W31P4Q-09-C-0067 awarded by the United States Army. The Government has certain rights in this invention.

BACKGROUND OF THE INVENTION

This application relates to a unique cooling arrangement for cooling inside of an electronics enclosure.

Modern electronics provide control for increasingly complex operations. Electronics generate heat, and systems for cooling of the electronics need to handle increasingly high levels of cooling, particularly as the complexity of the electronic controls increases.

One particular type of electronic control is a transformer. Typically, the transformer may be mounted within a housing with additional electronics. Adequately cooling these electronics and the transformer has proven challenging.

The assignee of the present application has developed a blower diffuser which provides a high volume of cooling air flow in a relatively small package. However, this blower diffuser has not been proposed to be incorporated into an enclosure in a way to adequately cool the electronics, as mentioned above.

SUMMARY OF THE INVENTION

An electronics enclosure has a blower and diffuser received within an enclosure. Electronic components are also received within the enclosure. The blower diffuser is positioned in contact with at least one of the electronic components. A shroud surrounds the blower diffuser and at least one electronic component, and is spaced from an outer surface of at least one electronic component. An opening is formed through the shroud, such that air can be driven within the shroud from the blower diffuser, and across at least one electronic component, and then outwardly of the opening. A heat exchanger is positioned in the path of air leaving the opening.

These and other features of this application will be best understood from the following specification and drawings, the following of which is a brief description.

DETAILED DESCRIPTION

Figure 1:
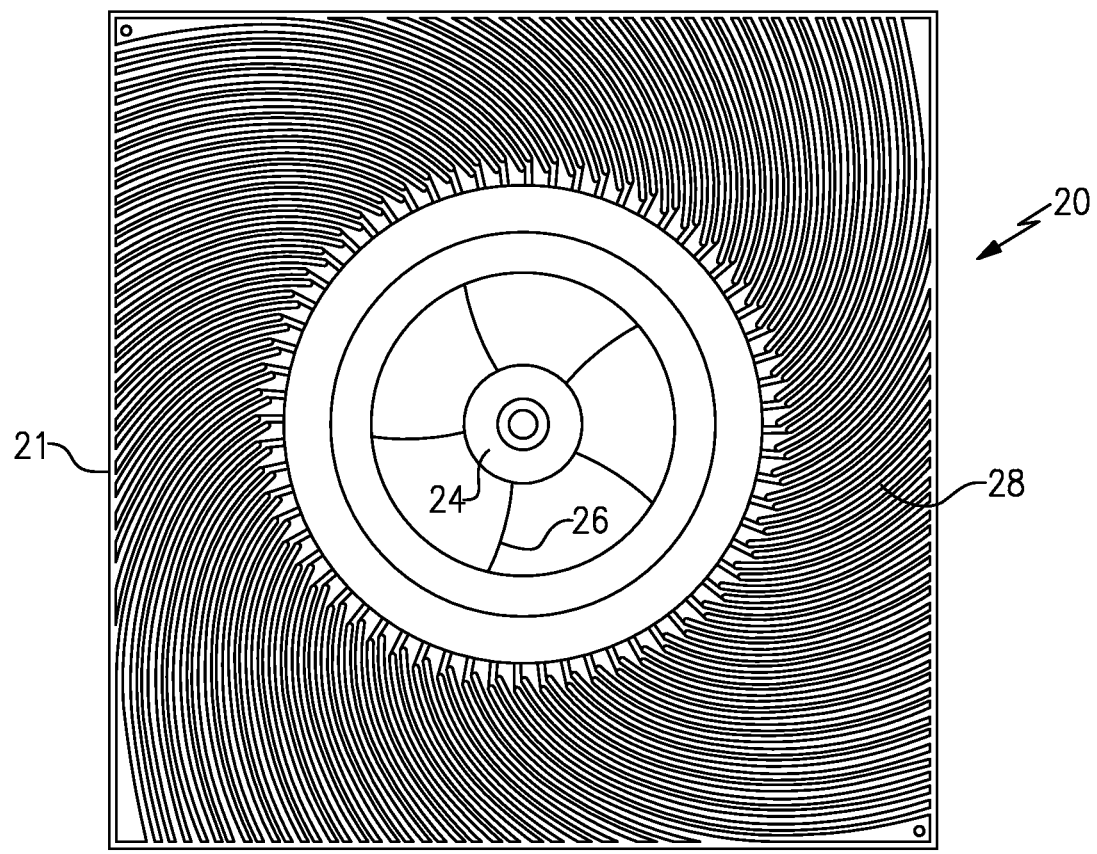
FIG. 1 shows a blower diffuser.

FIG. 1 shows a blower diffuser 20 having an inlet 24 leading to a bladed impeller 26. A motor drives a bladed impeller 26 to take air in axially into inlet 24 (as shown at 200 in FIG. 2), and directs the air radially outwardly. A plurality of guide vanes 28 are positioned about the circumference of the impeller 26 to provide a diffuser and heat transfer fins. Thus, the blower diffuser 20 also functions as a heat exchanger.

FIG. 1 shows the footprint of the blower diffuser 20. As can be appreciated, the blower diffuser 20 has a relatively square outer periphery 21. Of course, other shapes may be utilized.

Figure 2:
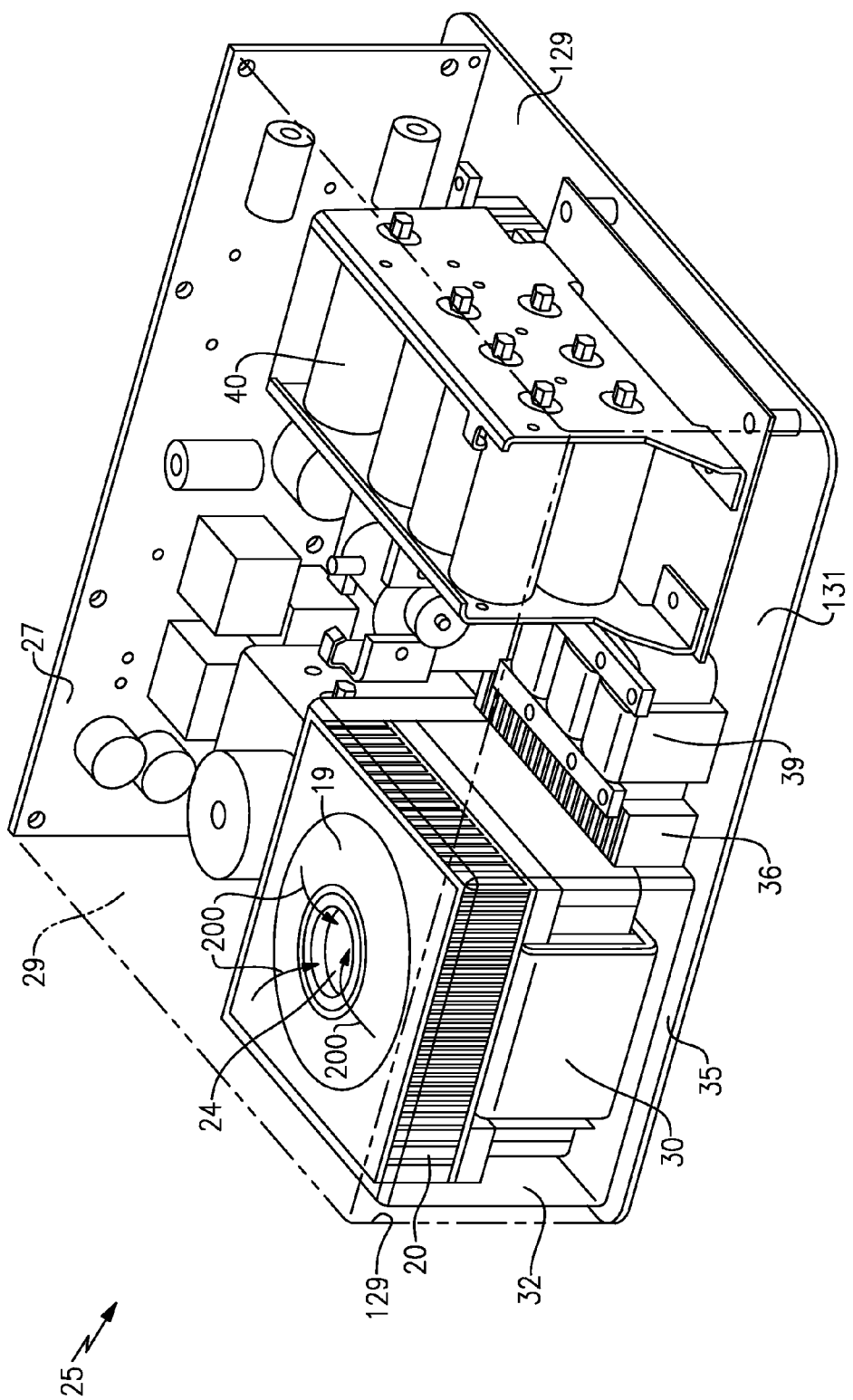
FIG. 2 shows an electronics enclosure with a cover removed.

FIG. 2 shows an electronics enclosure 25. As shown in FIG. 2, there is actually a cover 19 on blower diffuser 20 (not illustrated in FIG. 1), which sits around the inlet 24, and encloses the bladed impeller 26. The blower diffuser 20 is positioned within the enclosure 25. In this Figure, a rear wall 27 is shown. A top wall 29, side walls 129, and front wall 131 are shown in phantom such that the interior of the enclosure can be understood.

The blower diffuser 20 has its inlet 24 spaced from the top wall 29, such that air can circulate within the enclosure 25. The blower diffuser 20 is positioned in contact with a transformer 30. The transformer 30 is positioned on a bottom wall 35, which may function as a cold plate. A shroud 32 surrounds the transformer 30, and the blower diffuser 20. A heat exchanger 36 is positioned adjacent one side of the transformer 30, and vertically spaced from the blower diffuser 20. Other electronics received within the enclosure 25, and as an example, may include a capacitor bank 40 and an inductor 39.

Figure 3:
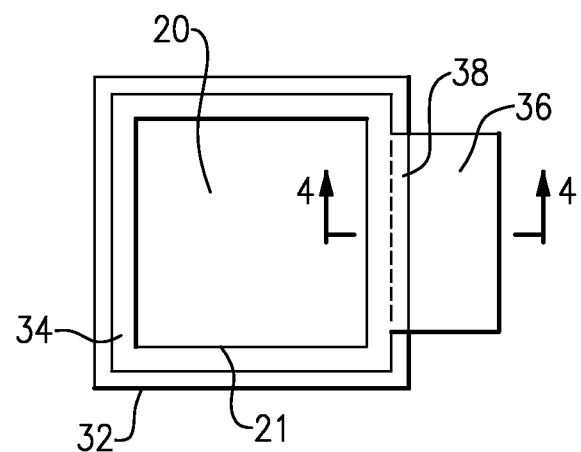
FIG. 3 shows a portion of the electronics enclosure.

FIG. 3 shows the shroud 32 spaced from the outer periphery 21 of the blower diffuser 20 (and transformer 30), such that there is air flow space 34 about the outer circumference of the transformer 30. An opening 38 in the shroud 32 is shown, which passes air across the heat exchanger 36.

Figure 4:
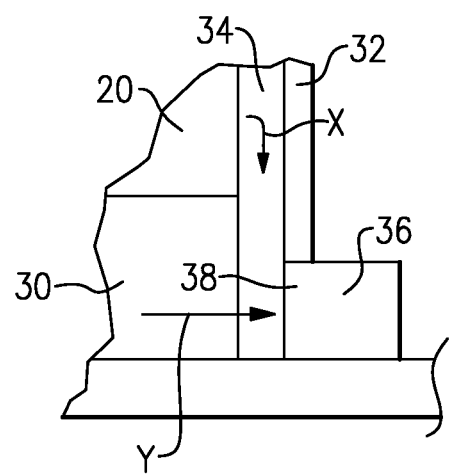
FIG. 4 is a view along line 4-4 as shown in FIG. 3.

FIG. 4 shows the arrangement with the air flow leaving the blower diffuser in a radially outward direction as shown at X, and being directed vertically along walls of the shroud 32 to pass over the transformer 30. From FIG. 3 one can appreciate this air flow would be around the entire circumference of the transformer 30. The air all eventually is directed as shown at Y, through the opening 38. The heat exchanger 36 could sit within the opening 38 or may be positioned adjacent to it.

As understood, the blower diffuser will operate to bring air into the inlet 24, and the impeller 26 will move that air radially outwardly and through the guide vanes 28 to surround the circumference of the transformer 30. That air then cools the transformer 30, and passes outwardly through opening 38, across the heat exchanger 36. Heat taken out of this air will pass into the cold plate, or bottom wall, 35. The air also circulates within the enclosure 25, and provides efficient cooling from a relatively small cooling package taken up by the blower diffuser 20, and the heat exchanger 36.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:
1. An electronics enclosure comprising:
a blower diffuser received within an enclosure;
electronic components also received within said enclosure, with said blower diffuser positioned in contact with at least one of said electronic components, and a shroud surrounding said blower diffuser and said at least one of said electronic components, with said shroud being spaced from an outer surface of at least one of said electronic components; and
an opening formed through said shroud, such that air can be driven within said shroud from said blower diffuser, and across at least one of said electronic components, and then outwardly of said opening, with a heat exchanger positioned in the path of air leaving said opening.

2. The enclosure as set forth in claim 1, wherein said blower diffuser brings air in an axial direction into an inlet, and an impeller drives the air radially outwardly across guide vanes.

3. The enclosure as set forth in claim 2, wherein air downstream of said guide vanes then passes across at least one of said electronic components.

4. The enclosure as set forth in claim 3, wherein a top wall of said blower diffuser sits spaced away from an outer wall of said electronics enclosure, such that air can circulate within said electronics enclosure, and reach said inlet.

5. The enclosure as set forth in claim 1, wherein at least one electronic component is a transformer.

6. The enclosure set forth in claim 5, wherein said electronic components also include at least a capacitor bank and an inductor.

7. The enclosure as set forth in claim 1, wherein at least one of said electronic components is in contact with a cold plate.

8. The enclosure as set forth in claim 7, wherein said heat exchanger also is in contact with said cold plate.

* * * * *